(12) United States Patent
Yang et al.

(10) Patent No.: US 10,037,095 B2
(45) Date of Patent: Jul. 31, 2018

(54) METHODS OF FORMING NANOSTRUCTURE CONDUCTIVE FILMS AND TOUCH DEVICES INCLUDING THE NANOSTRUCTURE CONDUCTIVE FILMS

(71) Applicant: TPK Touch Solutions Inc., Taipei (TW)

(72) Inventors: Shun-Jie Yang, New Taipei (TW); Hong-Siang Shao, Taipei (TW); En-Chin Chang, Taipei (TW); Hsi-Chien Lin, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 75 days.

(21) Appl. No.: 14/934,174

(22) Filed: Nov. 6, 2015

(65) Prior Publication Data

US 2016/0132165 A1    May 12, 2016

(30) Foreign Application Priority Data

Nov. 7, 2014    (CN) .......................... 2014 1 0624691

(51) Int. Cl.
*G06F 3/041*    (2006.01)
*C23F 4/00*    (2006.01)
(Continued)

(52) U.S. Cl.
CPC .............. *G06F 3/041* (2013.01); *B82Y 15/00* (2013.01); *B82Y 40/00* (2013.01); *C23F 4/00* (2013.01);
(Continued)

(58) Field of Classification Search
CPC .. G06F 3/041; G06F 2203/04103; C23F 4/00; H01L 21/321; H01L 21/3065; B82Y 15/00; B82Y 40/00
See application file for complete search history.

(56) References Cited

U.S. PATENT DOCUMENTS

2007/0126037 A1*  6/2007  Ikeda ..................... B82Y 10/00
                                                                                257/288
2011/0088770 A1*  4/2011  Allemand .............. B82Y 10/00
                                                                                136/256

(Continued)

FOREIGN PATENT DOCUMENTS

KR        20140055351 A  *  5/2014

*Primary Examiner* — Anita Karen Alanko
(74) *Attorney, Agent, or Firm* — Cooper Legal Group, LLC

(57) ABSTRACT

The present disclosure provides a method of forming a nanoscale conductive film. The method comprises providing a nanoscale base film, forming a first patterned insulating layer on the nanoscale base film, and etching the nanoscale base film in a current generation system, using the first patterned insulating layer as a mask. The nanoscale base film includes a substrate, a first overcoat on one side of the substrate, and a first nano material layer laminated between the substrate and the first overcoat. The first patterned insulating layer is formed on the first overcoat, exposing portions of the first overcoat. In the first nano material layer, first regions are masked by the first insulating layer and second regions are not masked by the first insulating layer. The first regions and the second regions are electrically isolated from each other after etching the nanoscale base film in the current generation system.

12 Claims, 18 Drawing Sheets

(51) Int. Cl.
   *H01L 21/321*      (2006.01)
   *H01L 21/3065*     (2006.01)
   *B82Y 15/00*       (2011.01)
   *B82Y 40/00*       (2011.01)

(52) U.S. Cl.
   CPC .............. *G06F 2203/04103* (2013.01); *H01L 21/3065* (2013.01); *H01L 21/321* (2013.01)

(56) References Cited

U.S. PATENT DOCUMENTS

| | | | |
|---|---|---|---|
| 2012/0205614 A1* | 8/2012 | Templier | H01L 27/156 257/9 |
| 2013/0061923 A1* | 3/2013 | Muroyama | H01G 9/2031 136/258 |
| 2013/0323482 A1* | 12/2013 | Poon | H05K 1/0296 428/212 |
| 2013/0341704 A1* | 12/2013 | Rachmady | H01L 29/66545 257/327 |
| 2013/0342221 A1* | 12/2013 | Virkar | G06F 3/041 324/661 |
| 2014/0262443 A1* | 9/2014 | Mansky | H05K 3/02 174/250 |
| 2015/0348675 A1* | 12/2015 | Qu | H01B 3/46 428/215 |
| 2016/0133349 A1* | 5/2016 | Cho | B82Y 10/00 428/196 |
| 2016/0162063 A1* | 6/2016 | Lovenich | H05K 9/0096 428/209 |

\* cited by examiner

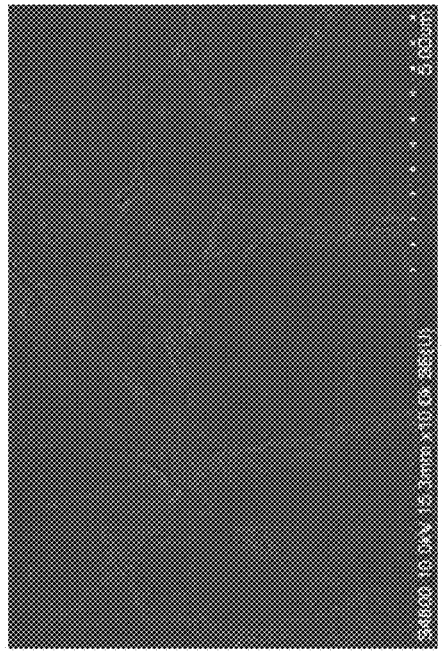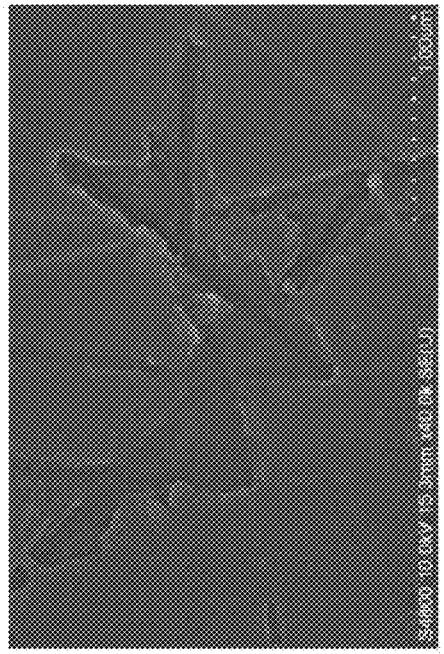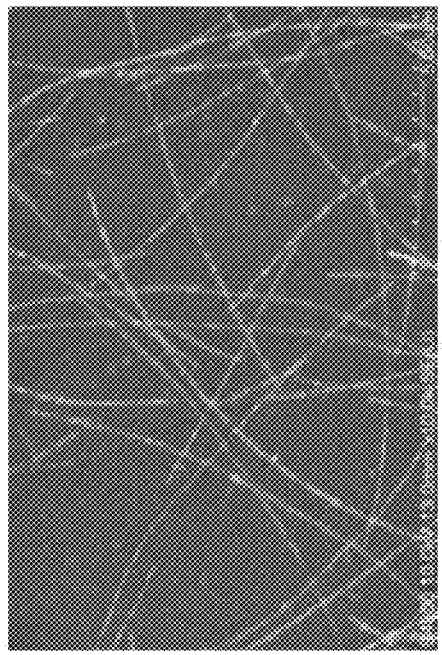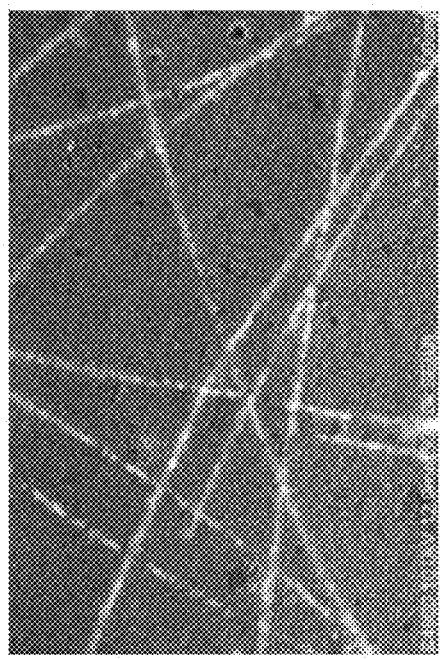
FIG. 7A
FIG. 7B
FIG. 7C
FIG. 7D

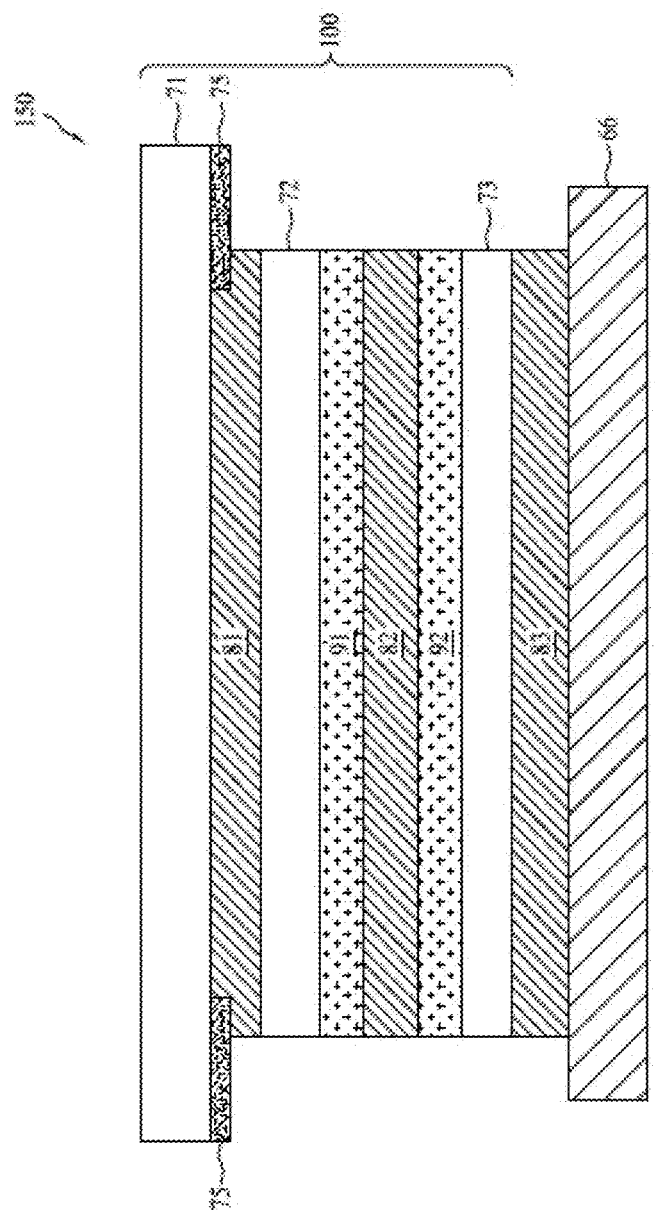

METHODS OF FORMING NANOSTRUCTURE CONDUCTIVE FILMS AND TOUCH DEVICES INCLUDING THE NANOSTRUCTURE CONDUCTIVE FILMS

BACKGROUND OF THE INVENTION

This application claims priority to China Application Serial Number 201410624691.2, filed Nov. 7, 2014, which is herein incorporated by reference.

Filed of the Invention

The present disclosure relates to conductive films and, more particularly, to a method of forming a nanoscale conductive film and a touch device including the nanoscale conductive film.

Related Art of the Invention

Touch panels or touch screens have become more and more popular in electronic devices including, in particular, portable or hand-held devices such as personal digital assistants (PDAs) and mobile phones. In some touch-panel display devices, indium tin oxide (ITO) is still a required transparent conductive material. However, it has always been an important topic in the touch panel industry to seek an alternative material for ITO conductive films, no matter whether the motivation is due to the fact that ITO has disadvantages (such as brittleness and inflexibility) or for cost reduction. Nanoscale conductive films, such as silver nanowire (SNW) transparent conductive films, possess the properties of excellent electrical conductivity and optical transmittance as well as cost efficiency, and thus have become a powerful candidate as an alternative to ITO conductive films.

In some existing manufacturing approaches, a wet etching process is used to define the electric characteristics of an SNW conductive film. SNW conductive film includes an overcoat for securing an SNW coating on a substrate and protecting the SNW coating from oxidation or vulcanization due to ambient molecule reaction in the air. Nevertheless, the overcoat may on the other hand significantly reduce the interaction between the etchant and the SNW, resulting in uneven etch, insufficient etch and a large haze change after etch. Moreover, residue of the etchant may be left over after the etching process, which may cause a subsequently formed SNW conductive film to degrade in electrical characteristics.

In addition, in some existing manufacturing approaches, a dry etching process is used to define the electrical characteristics of an SNW conductive film by, for example, bombarding an SNW conductive film by etchant particles in a vacuum environment. However, such etching processes may not effectively protect the overcoat and thus the SNW conductive film may be liable to degrade in electrical characteristics.

Given the above, it can be found that effectively changing the electric characteristics of a nanoscale conductive film while maintaining its optical transmittance and haze is an important topic in the field of touch panel display device.

SUMMARY OF THE INVENTION

The present disclosure provides a touch-panel display device to overcome or alleviate the above-mentioned issues.

A method of forming a nanoscale conductive film in accordance with various embodiments is provided. The method comprises providing a nanoscale base film, which includes a substrate, a first overcoat on one side of the substrate, and a first nano material layer laminated between the substrate and the first overcoat, forming a first patterned insulating layer on the first overcoat, the first patterned insulating layer exposing portions of the first overcoat and defining in the first nano material layer first regions masked by the first patterned insulating layer and second regions not masked by the first patterned insulating layer, and electrically isolating the first regions from each other by the second regions by etching the nanoscale base film in a current generation system, using the first patterned insulating layer as a mask.

In an embodiment, a haze difference between the first regions and the second regions in the first nano material layer is not greater than 0.1%.

In another embodiment, etching the nanoscale base film comprises introducing air, nitrogen ($N_2$) or a combination thereof as a reactive gas.

In yet another embodiment, the current generation system includes one of a dielectric barrier discharge (DBD) type current generation system and an arc jet type current generation system.

In still another embodiment, the first nano material layer includes silver nanowire (SNW).

In yet still another embodiment, the first patterned insulating layer includes a material having optical properties compatible with the first nano material layer.

In another embodiment, the nano base film includes a second overcoat on the other side of the substrate, and a second nano material layer laminated between the substrate and the second overcoat. The method further comprises forming a second patterned insulating layer on the second overcoat, the second patterned insulating layer exposing portions of the second overcoat and defining in the second nano material layer first regions masked by the second patterned insulating layer and second regions not masked by the second patterned insulating layer, and electrically isolating the first regions from each other by the second regions by etching the nanoscale base film in a current generation system, using the second patterned insulating layer as a mask.

In still another embodiment, a haze difference between the first regions and the second regions in the second nano material layer is not greater than 0.1%.

Embodiments of the disclosure also provide a method of forming a nanoscale conductive film. The method comprises providing a nanoscale base film, which includes a substrate, a first overcoat on one side of the substrate, and a first nano material layer laminated between the substrate and the first overcoat and divided into first regions and second regions, and electrically isolating the first regions from each other by the second regions by etching the second regions in the first nano material layer of the nanoscale base film in an arc jet type current generation system.

In an embodiment, a haze difference between the first regions and the second regions in the first nano material layer is not greater than 0.1%.

In another embodiment, etching the nanoscale base film comprises introducing air, nitrogen ($N_2$) or a combination thereof as a reactive gas.

In yet another embodiment, the first nano material layer includes silver nanowire (SNW).

In still another embodiment, the nano base film includes a second overcoat on the other side of the substrate, and a second nano material layer laminated between the substrate and the second overcoat and divided into first regions and second regions. The method further comprises electrically isolating in the second nano material layer the first regions from each other by the second regions by etching the second regions in the second nano material layer of the nanoscale base film in an arc jet type current generation system.

In yet still another embodiment, a haze difference between the first regions and the second regions in the second nano material layer is not greater than 0.1%.

Some embodiments provide a touch-panel display device. The touch-panel device comprises a transparent substrate including a first surface and a second surface on opposite sides of the transparent substrate, respectively, a display module at the first surface side of the transparent substrate, and a first sensing electrode layer, disposed between the substrate and the display module, including a first nano material layer having first regions and second regions, the first regions being electrically isolated from each other by the second regions, and a haze difference between the first regions and the second regions is not greater than 0.1%.

In an embodiment, the first sensing electrode layer is disposed on the first surface of the transparent substrate, and includes first electrodes and second electrodes interleaved with each other in the first regions.

In another embodiment, the touch-panel display device further comprises a first carrier configured to support the first sensing electrode layer between the transparent substrate and the display module, and comprises first electrodes and second electrodes interleaved with each other in the first regions.

In yet another embodiment, the touch-panel display device further comprises a first carrier and a second sensing electrode layer. The first carrier is disposed between the transparent substrate and the display module. The first sensing electrode layer is disposed on a first surface of the first carrier, and the second sensing electrode layer is disposed on a second surface of the first carrier, wherein the first surface and second surface are on opposite sides of the first carrier.

In still another embodiment, the second sensing electrode layer includes a second nano material layer having first regions and second regions. Moreover, the first regions are electrically isolated from each other by the second regions. In addition, a haze difference between the first regions and the second regions in the second nano material layer is not greater than 0.1%.

In yet still another embodiment, the first sensing electrode layer includes in the first regions thereof first electrodes arranged in a first direction, and the second sensing electrode layer includes in the first regions thereof second electrodes arranged in a second direction.

In another embodiment, the touch-panel display device further comprises a first carrier and a second sensing electrode layer. The first carrier is disposed between the transparent substrate and the display module, wherein the first sensing electrode layer is disposed on a first surface of the first carrier and the second sensing electrode layer is disposed, between the first sensing electrode layer and the first carrier, on the first carrier.

In still another embodiment, the second sensing electrode layer includes a second nano material layer having first regions and second regions. Moreover, the first regions are electrically isolated from each other by the second regions. In addition, a haze difference between the first regions and the second regions in the second nano material layer is not greater than 0.1%.

In yet still another embodiment, the first sensing electrode layer includes in the first regions thereof first electrodes arranged in a first direction, and the second sensing electrode layer includes in the first regions thereof second electrodes arranged in a second direction.

In the above-mentioned embodiments, the methods can effectively achieve a desired etching effect in order to define the electrical characteristics of a nanoscale conductive film. As a result, conductive regions are electrically isolated from each other by non-conductive regions in the nanoscale conductive film.

Moreover, the methods can effectively reduce damage on an overcoat of a nanoscale conductive film caused during an etching process, and maintain the optical characteristics of the nanoscale conductive film.

Furthermore, compared to some existing approaches of forming nanoscale conductive films, the methods can significantly reduce the manufacturing time. In addition, the etching process for a nanoscale conductive film prepared by the methods is conducted in a current generation system. As a result, conductive regions and non-conductive regions, either before or after etching, exhibit no obvious difference in optical performance. For example, the haze difference is not greater than 0.3% or even 0.1%, which makes it more possible to hide the wiring in a touch-panel display device and thus adds an aesthetic touch to the appearance of the touch-panel display device.

The foregoing has outlined rather broadly the features and technical advantages of the disclosure in order that the detailed description that follows may be better understood. Additional features and advantages will be described hereinafter, and form the subject of the claims. It should be appreciated by persons having ordinary skill in the art that the conception and specific embodiments disclosed may be readily utilized as a basis for modifying or designing other structures or processes for carrying out the same purposes. It should also be realized by persons having ordinary skill in the art that such equivalent constructions do not depart from the spirit and scope of the disclosure as set forth in the appended claims.

BRIEF DESCRIPTION OF THE DRAWINGS

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to persons having ordinary skill in the art to which the disclosure relates. Reference numerals may be repeated throughout the embodiments, but this does not necessarily require that feature(s) of one embodiment apply to another embodiment, even if they share the same reference number.

It will be understood that when an element is referred to as being "connected to" or "coupled to" another element, it may be directly connected to or coupled to the other element, or intervening elements may be present.

The objectives and advantages are illustrated with the following description and upon reference to the accompanying drawings, in which:

FIGS. 1A to 1D are schematic diagrams showing a method of manufacturing a nanoscale conductive film, in accordance with various embodiments.

FIGS. 2A to 2D are schematic diagrams showing a method of manufacturing a nanoscale conductive film, in accordance with other embodiments of the disclosure.

FIGS. 3A to 3D are schematic diagrams showing a method of manufacturing a nanoscale conductive film, in accordance with yet other embodiments of the disclosure.

Figure 4A:
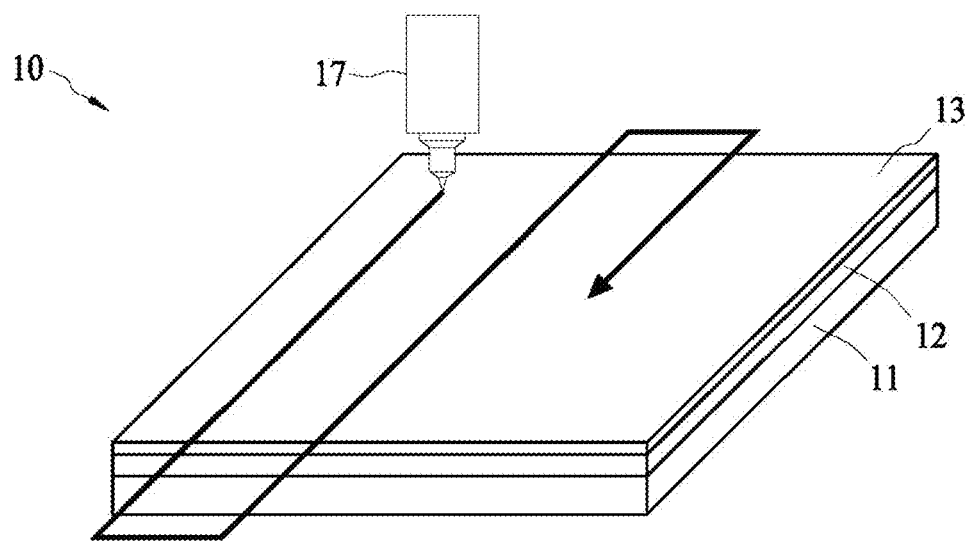
Figure 4B:
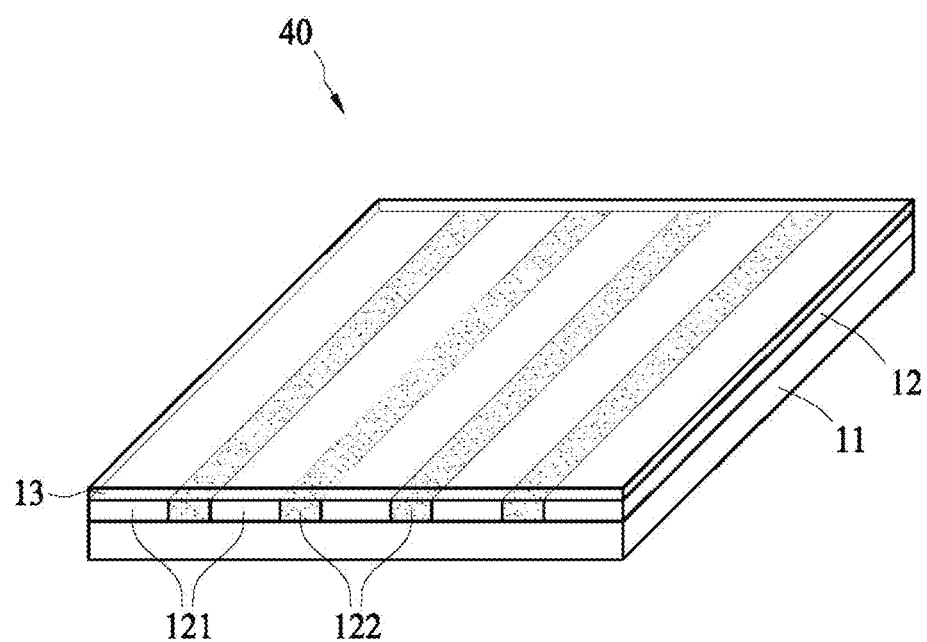

FIGS. 4A and 4B are schematic diagrams showing a method of manufacturing a nanoscale conductive film, in accordance with still other embodiments of the disclosure.

Figure 5A:
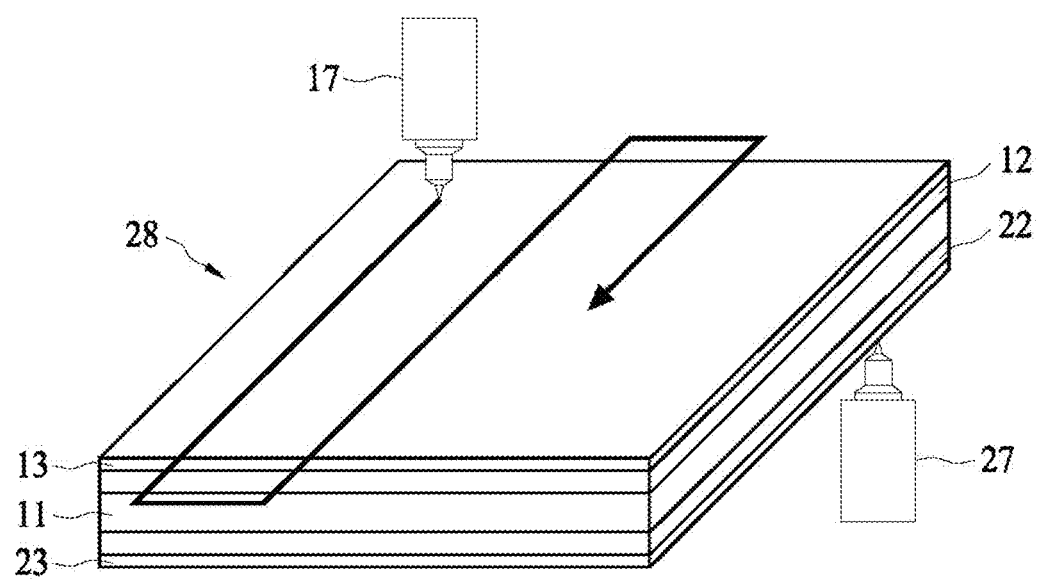
Figure 5B:
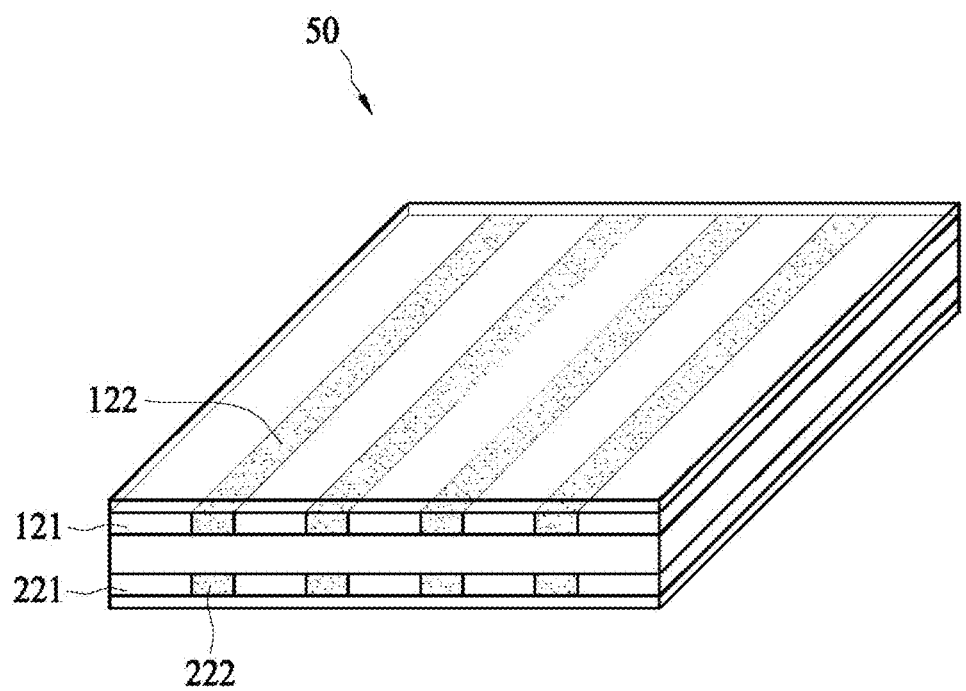

FIGS. 5A and 5B are schematic diagrams showing a method of manufacturing a nanoscale conductive film, in accordance with yet still other embodiments of the disclosure.

Figure 6B:
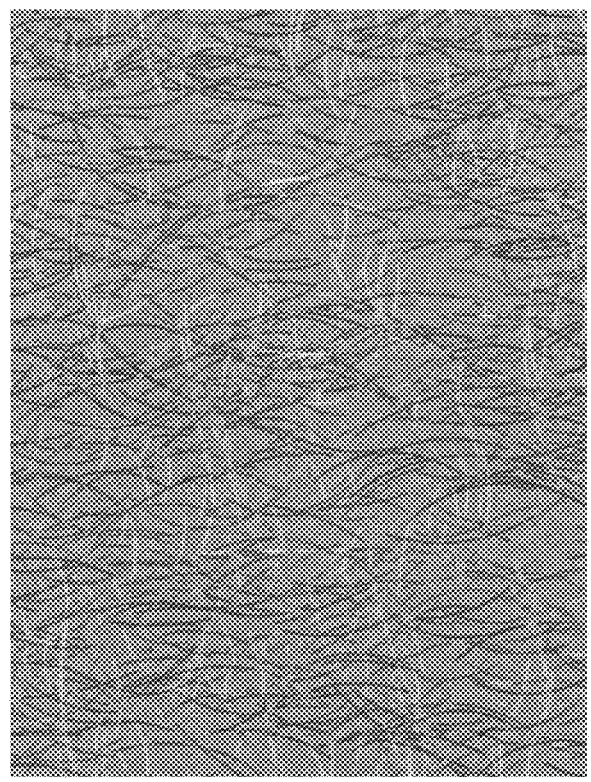
Figure 6A:
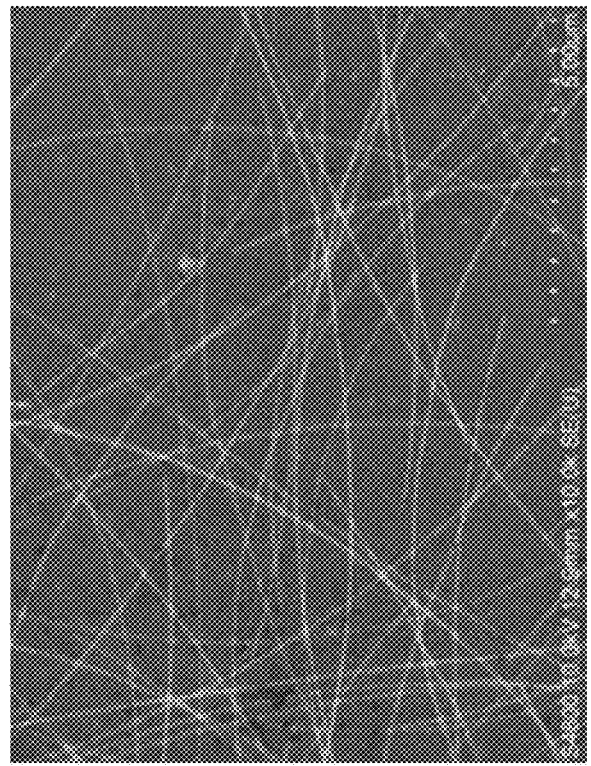

FIGS. 6A and 6B are enlarged photo diagrams of a nanoscale conductive film before etching.

FIGS. 7A and 7B are enlarged photo diagrams of a nanoscale conductive film prepared according to embodiments of the disclosure and that are prepared by an existing approach, respectively.

FIGS. 7C and 7D are further enlarged photo diagrams of the nanoscale conductive films shown in FIGS. 7A and 7B, respectively.

Figure 8A:
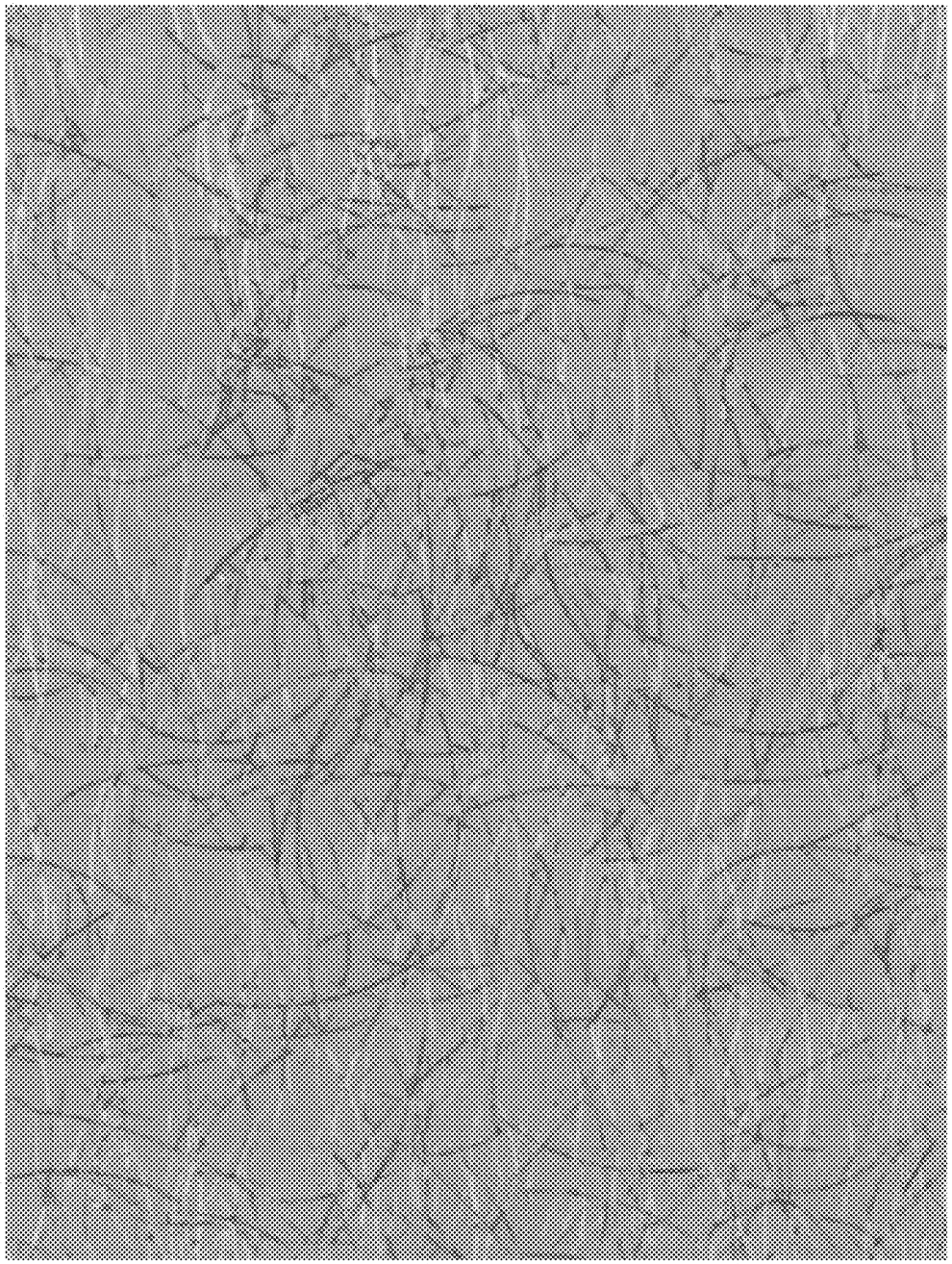

FIG. 8A is an enlarged photo diagram of a nanoscale conductive film prepared according to embodiments of the disclosure.

Figure 8B:
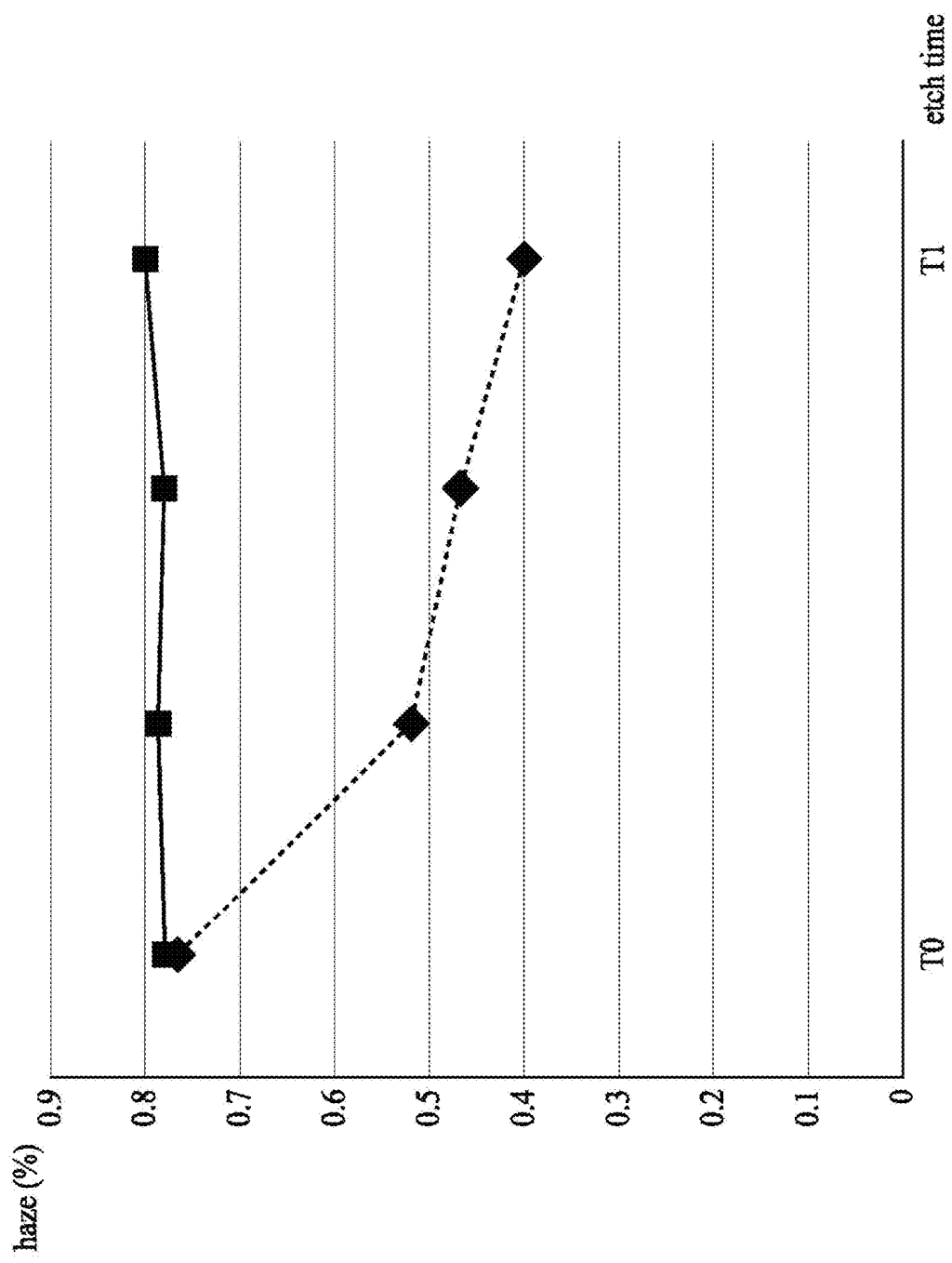

FIG. 8B is a diagram showing the haze, before and after etching, of a nanoscale conductive film prepared according to embodiments of the disclosure.

Figure 9B:
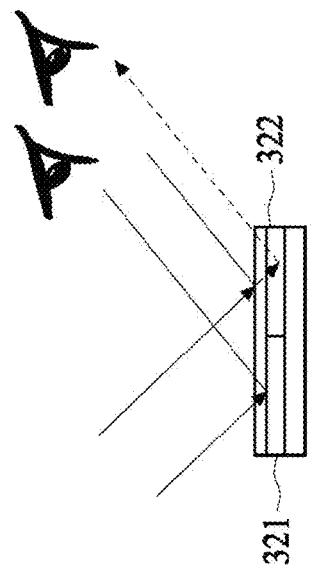
Figure 9A:
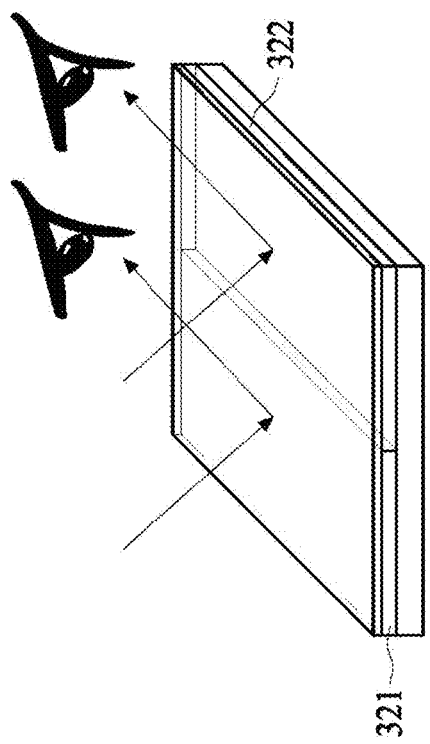

FIGS. 9A and 9B are schematic diagrams showing optical performance of a nanoscale conductive film prepared by an existing approach.

Figure 10B:
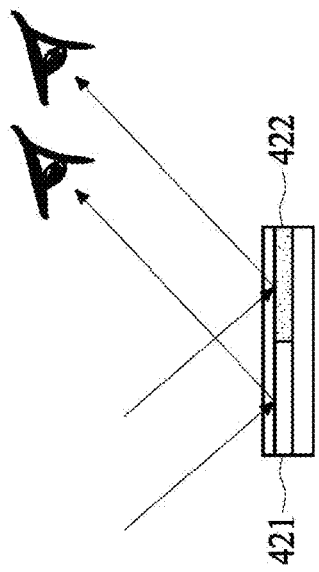
Figure 10A:
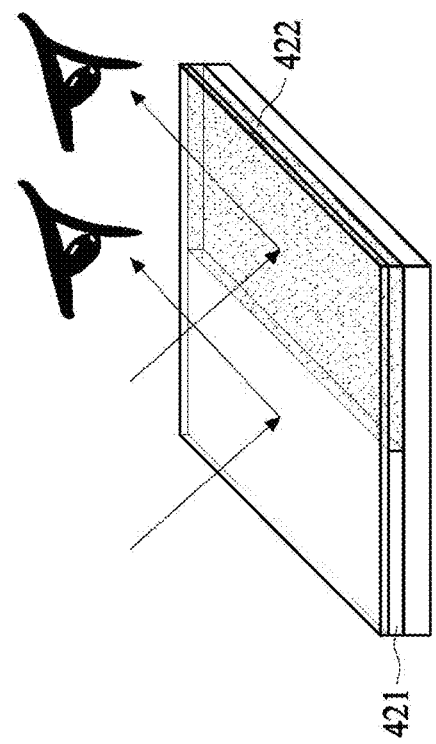

FIGS. 10A and 10B are schematic diagrams of a nanoscale conductive film prepared according to embodiments of the disclosure.

Figure 11:
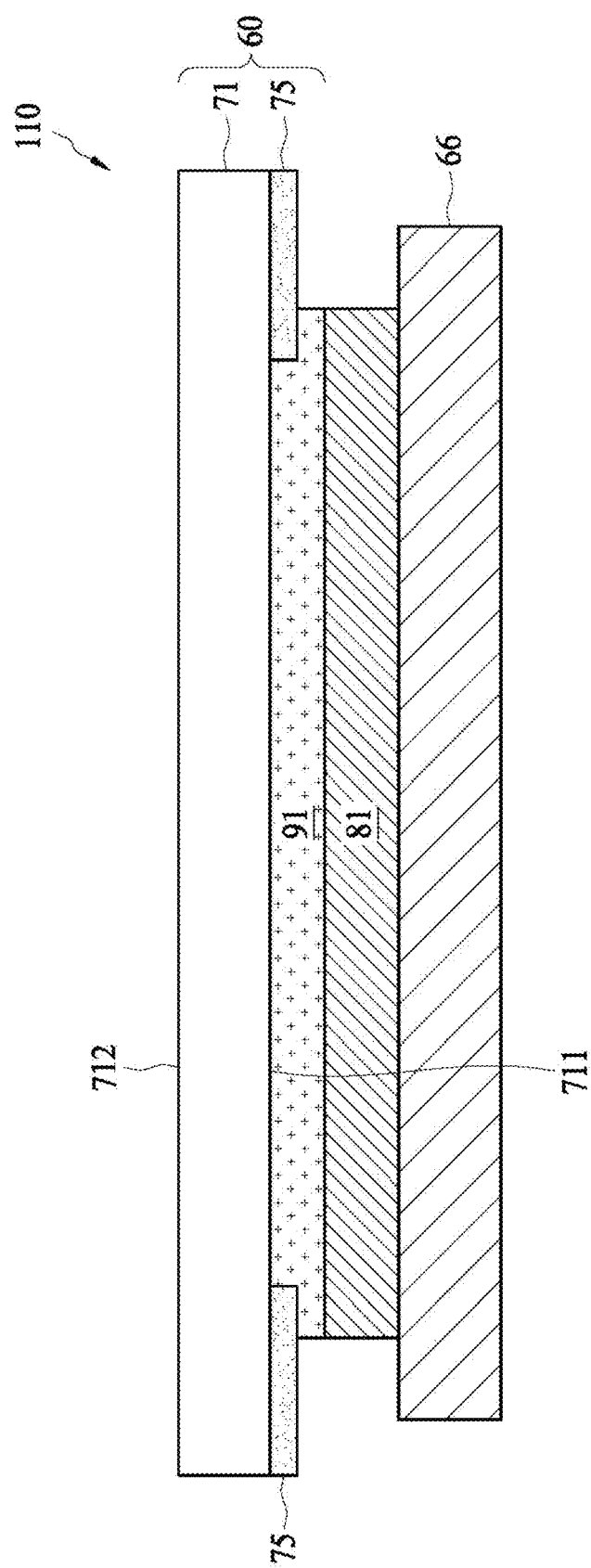

FIG. 11 is a schematic cross-sectional view of a touch-panel display device, in accordance with embodiments of the disclosure.

Figure 12:
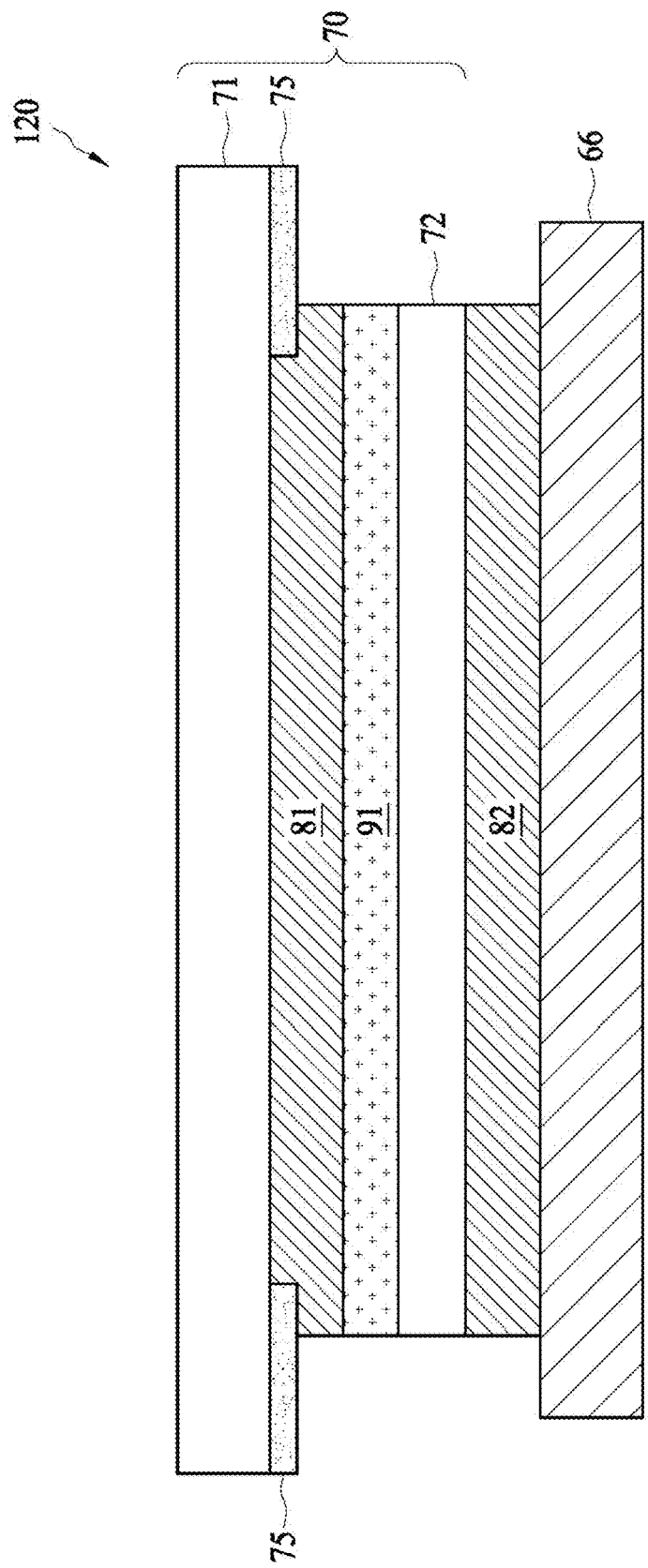

FIG. 12 is a schematic cross-sectional view of a touch-panel display device, in accordance with other embodiments of the disclosure.

Figure 13:
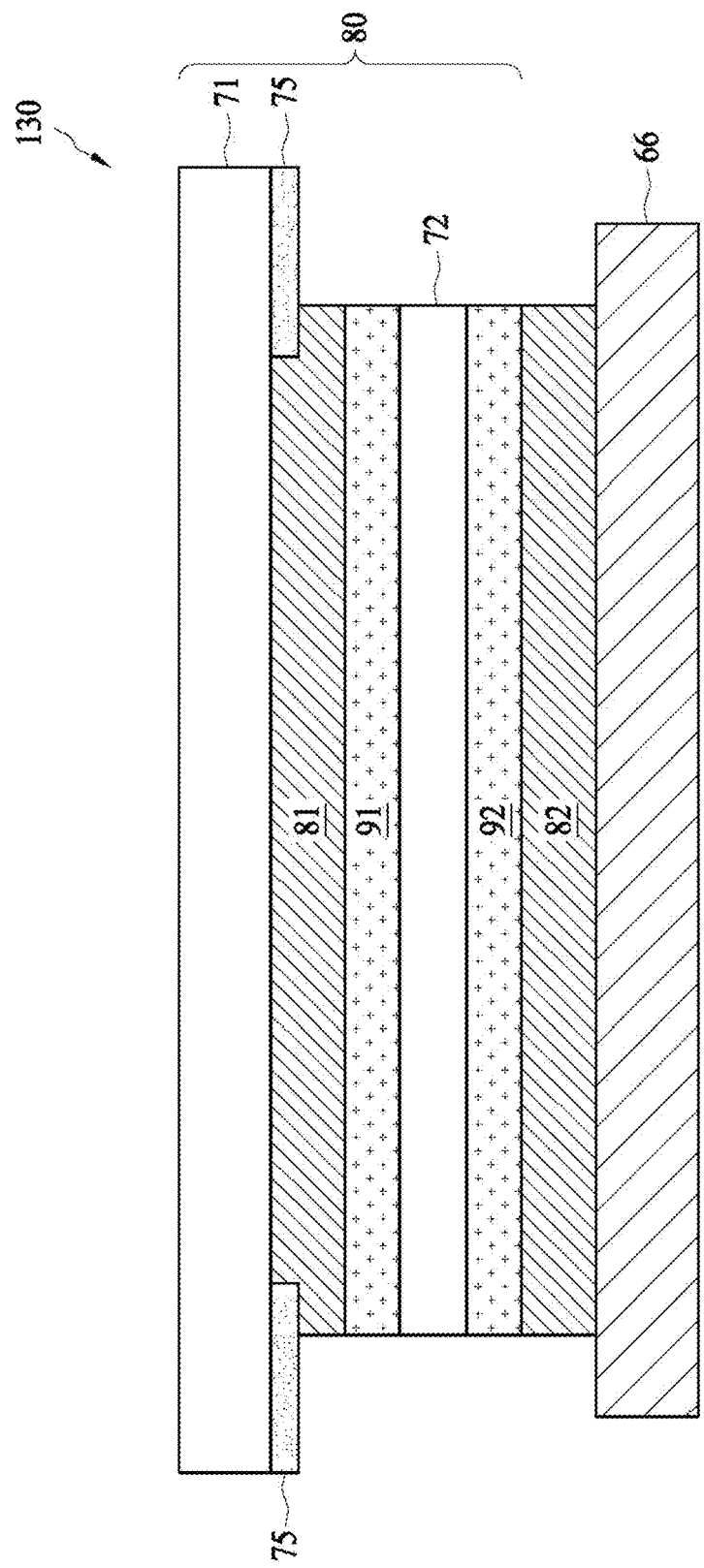

FIG. 13 is a schematic cross-sectional view of a touch-panel display device, in accordance with yet another embodiment of the disclosure.

Figure 14:
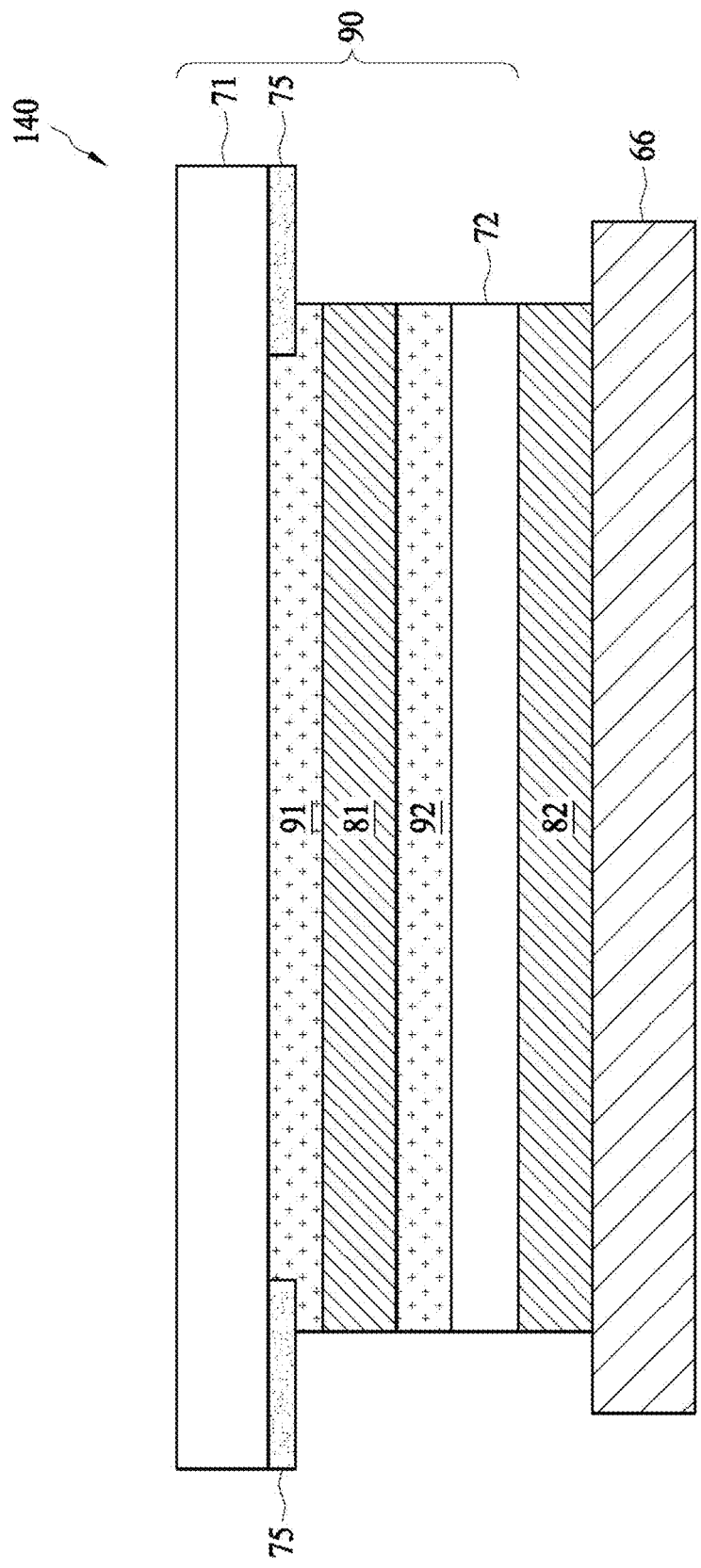

FIG. 14 is a schematic cross-sectional view of a touch-panel display device, in accordance with still other embodiments of the disclosure.

FIG. 15 is a schematic cross-sectional view of a touch-panel display device, in accordance with yet still other embodiments of the disclosure.

DETAILED DESCRIPTION OF THE INVENTION

The embodiments of the disclosure are shown in the following description with the drawings, wherein similar or same components are indicated by similar reference numbers.

Figure 1A:
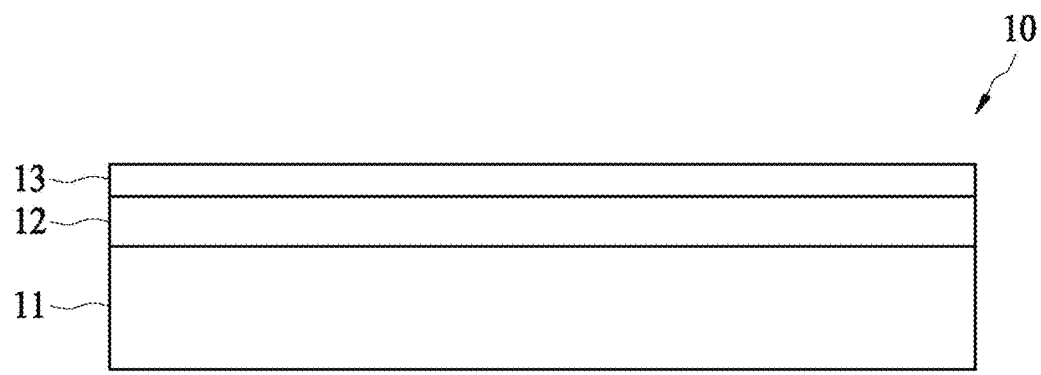

FIGS. 1A to 1D are schematic diagrams showing a method of manufacturing a nanoscale conductive film, in accordance with various embodiments of the disclosure. Referring to FIG. 1A, initially a nano base film 10 is provided, according to the method. The nanoscale base film 10 includes a substrate 11, a first overcoat 13 on one side of the substrate 11, and a first nano material layer 12 laminated between the substrate 11 and the first overcoat 13. In some embodiments, the substrate 11 includes a flexible, optically transmissive material such as polyethylene terephthalate (PET). In addition, the first overcoat 13 includes a material that is organic and porous. Moreover, the first nano material layer 12 includes silver nanowire (SNW) in a wire grid pattern having a reduced wire diameter below 100 nanometers (nm) due to nanonization. For example, the SNW is approximately 200 micrometers (um) in length and 50 nm in diameter, resulting in an aspect ratio of approximately 4000. Silver has excellent electrical conductivity, which is 100 times greater than indium tin oxide (ITO), and thus provides a faster response speed than ITO. Moreover, by controlling wire distribution density, the optical transmittance of SNW can reach as high as 92%. As a result, SNW possesses relatively high optical transmittance as well as high electrical conductivity. In some embodiments, the first nano material layer 12 includes one of gold (Au), palladium (Pd), platinum (Pt), copper (Cu) and nickel (Ni), or another suitable nano material.

Figure 1B:
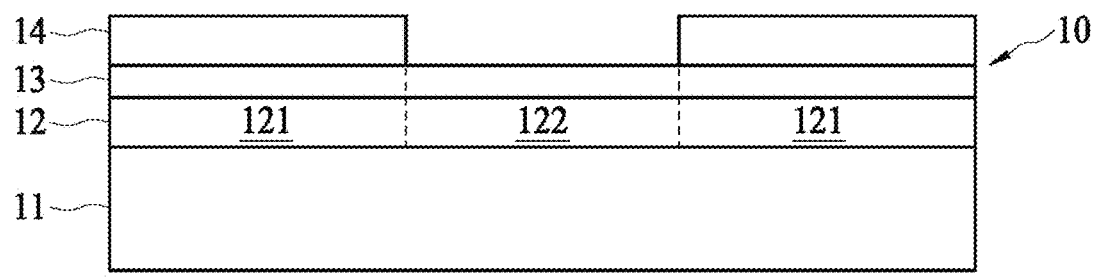

Referring to FIG. 1B, a first patterned insulating layer 14 is formed on the first overcoat 13 by, for example, coating an insulating layer on the first overcoat 13 followed by a printing, developing or transfer printing process. The first patterned insulating layer 14 exposes portions of the first overcoat 13, and as a result defines, in the first nano material layer 12, first regions 121 masked by the first patterned insulating layer 14 and second regions 122 not masked by the first patterned insulating layer 14. In some embodiments, a suitable material for the first patterned insulating layer 14 includes polyimide (PI). In some embodiments, the first patterned insulating layer 14 includes a material having optical properties compatible with the first nano material layer 12. For example, the first patterned insulating layer 14 has an index of refraction ranging from approximately 1.7 to 1.8. Moreover, the first insulating layer 14 may include an organic material, which has an index of refraction ranging from approximately 1.4 to 1.5.

Figure 1C:
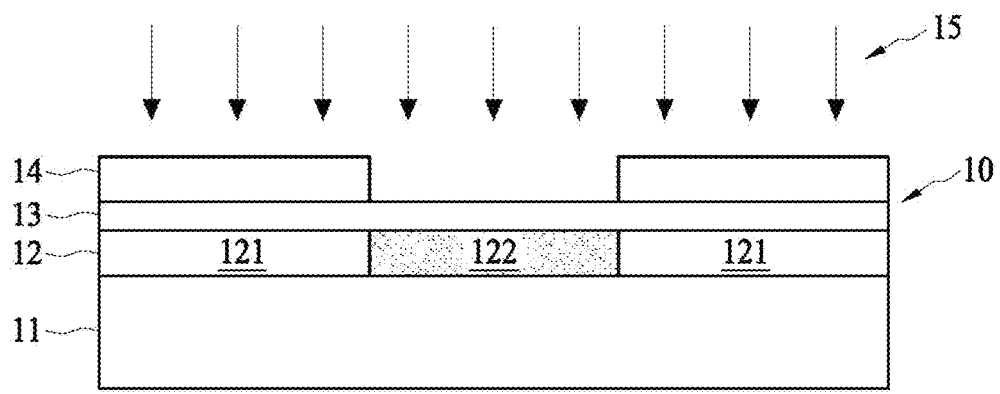

Referring to FIG. 1C, the nano base film 10 is etched, using the first patterned insulating layer 14 as a mask, in a current generation system 15. Consequently, the first regions 121 are electrically isolated from each other by the second regions 122. In some embodiments, the current generation system 15 includes a dielectric barrier discharge (DBD) type current generation system or an arc jet type current generation system.

The current generation system 15 refers to a mechanism that generates electric current based on the principle of high voltage discharge, in which a relatively high voltage of, for example, over 6000 volts is applied across dedicated electrodes while introducing a suitable amount of clean dry air (CDA) or nitrogen ($N_2$) or a combination thereof as a reactive gas. Compared to an existing vacuum bombarding system, the current generation system 15 eliminates a vacuum chamber, and thus significantly reduces the process time and cost. Moreover, since in an atmospheric environment the mean free path of electric current is reduced due to obstacles from air molecules, the etching performance is rather limited. Consequently, for example, only surface particles are removed without completely damaging the material or structure of an object under etch. As a result, damage caused by the etching process on the first overcoat 13 can be significantly reduced. Furthermore, in the nano metal wire such as SNW of the first nano material layer 12, outer electrons may become unstable due to the energy of the high voltage applied, which causes the nano metal wire to break. Since electric current in the air would take the path of least resistance, the SNW structure in the second regions 122 not masked by the first patterned insulating layer 14 is damaged by the electric current and thus loses its electrical conductivity. In contrast, the SNW structure in the first regions 121 masked by the first patterned insulating layer 14 is not damaged by the electric current and thus keeps its electrical conductivity. Therefore, in some embodiments, the first patterned insulating layer 14 may include an arbitrary insulating material. The method achieves an effective etching to define the electrical characteristics of the first nano material layer 12. Effectively, the first regions 121 maintain the original electrical conductivity while the second regions 122 lose electrical conductivity. Moreover, damage of the first overcoat 13 is significantly reduced, thereby maintaining the optical properties of the nano base film 10.

Figure 1D:
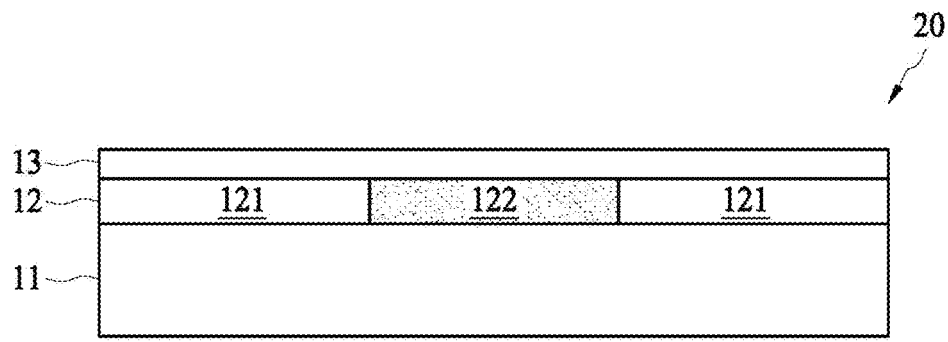

Referring to FIG. 1D, the first patterned insulating layer 14 is then removed, resulting in a nanoscale conductive film 20. In some embodiments, however, since the first patterned insulating layer 14 includes a material having optical properties compatible with the first nano material layer 12, there is no need to remove the first patterned insulating layer 14. Advantageously, the risk that the first overcoat 13 may be harmed by the process of removing can be reduced. The nanoscale conductive film 20 in implementation may serve as a sensing electrode layer for a touch-panel display device.

Figure 2A:
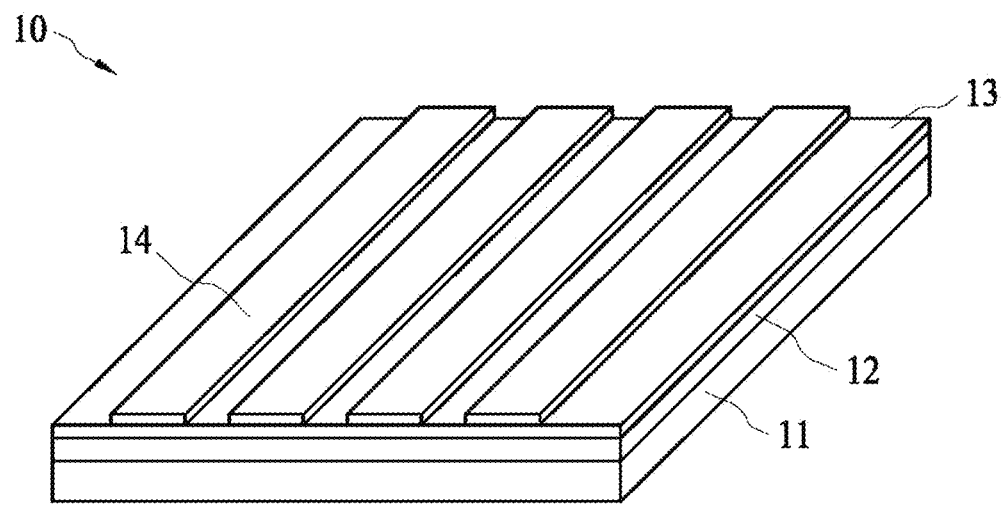

FIGS. 2A to 2D are schematic diagrams showing a method of manufacturing a nanoscale conductive film, in accordance with some embodiments. Referring to FIG. 2A, a first patterned insulating layer 14 is formed on a first overcoat 13 of a nano base film 10 by, for example, coating an insulating layer on the first overcoat 13 followed by a printing, developing or transfer printing process. In some embodiments, the first patterned insulating layer 14 includes longitudinal insulators spaced apart from each other. In some embodiments, the insulators of the first patterned insulating layer 14 may take the form of other suitable shapes such as triangles or trapezoids arranged in an interleaved configuration.

Figure 2B:
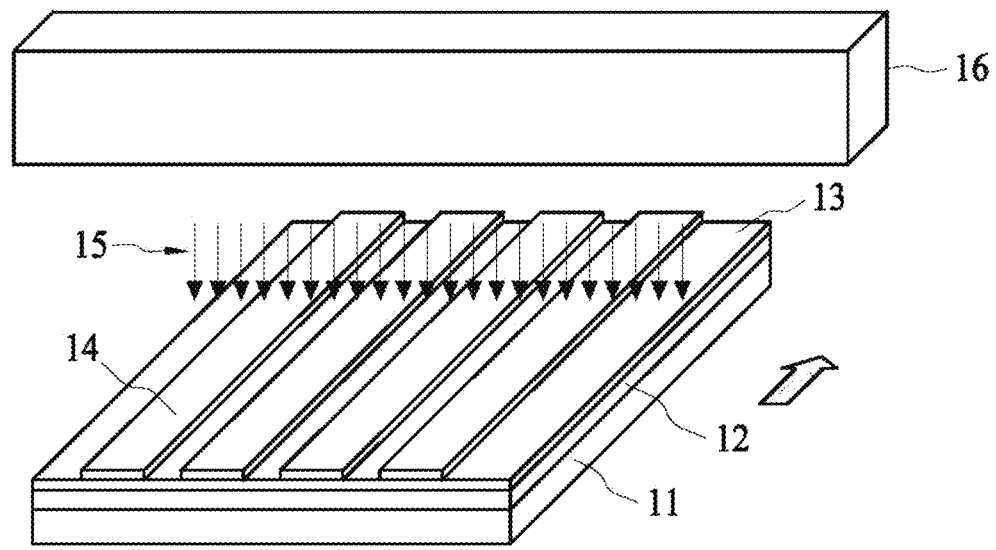
Figure 2C:
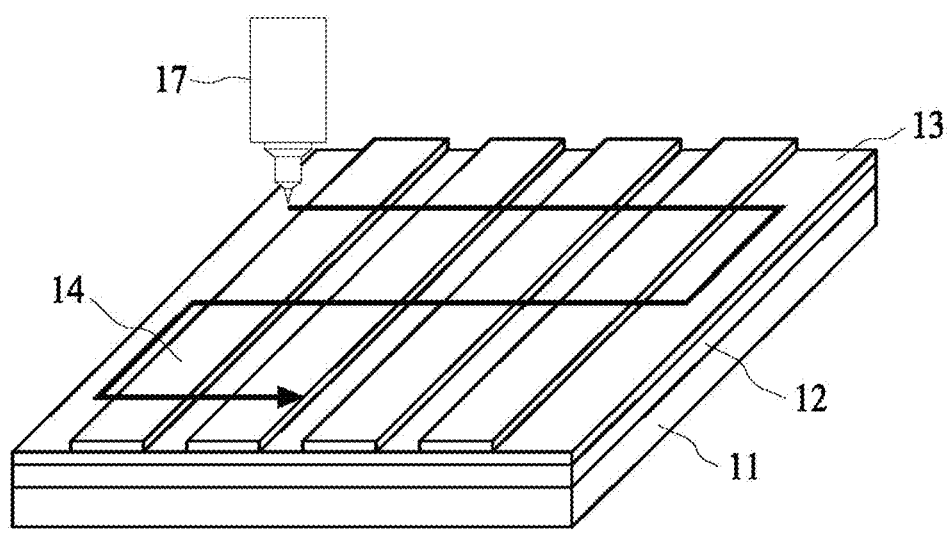

Referring to FIG. 2B, the first nano material layer 12 is etched, using the first patterned insulating layer 14 as a mask, in a current generation system 15. In some embodiments, the current generation system 15 includes a DBD system, in which the first nano material layer 12 is etched under the action of an electrode 16 along a predetermined direction (shown by a bold arrow). In some embodiments, referring to FIG. 2C, the current generation system 15 includes an arc jet system, in which the first nano material layer 12 is etched under the mask of the first patterned insulating layer 14 by a nozzle 17 along a predetermined path (indicated by an arrow).

Figure 2D:
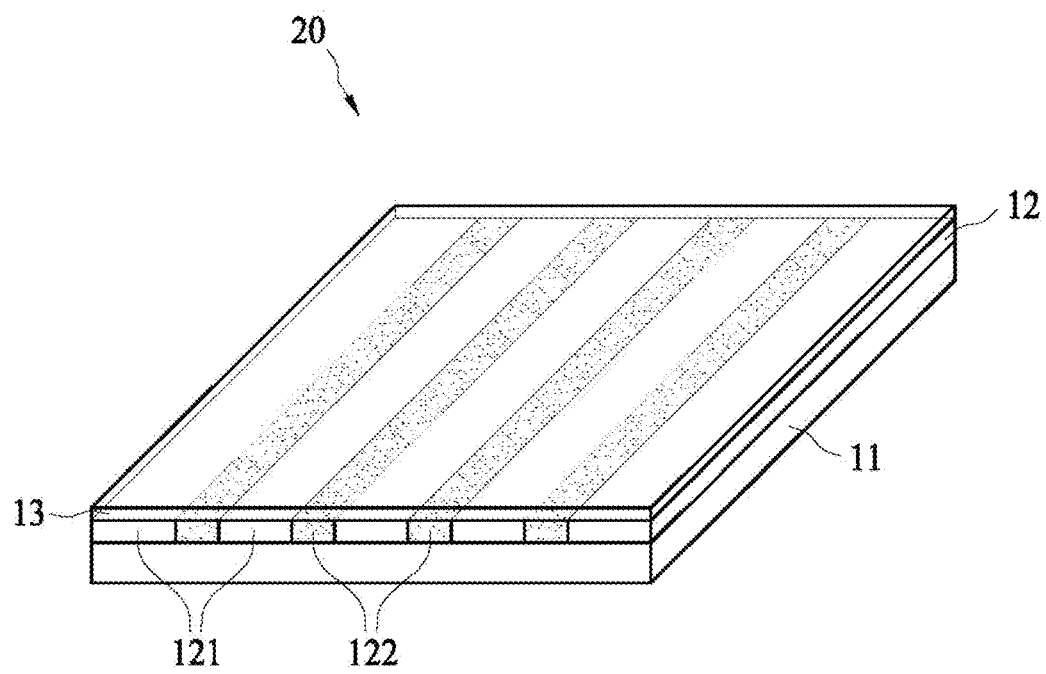

Referring to FIG. 2D, the first patterned insulating layer 14 is then removed, resulting in a nanoscale conductive film 20. In some embodiments, however, since the first patterned insulating layer 14 includes a material having optical properties compatible with the first nano material layer 12, there is no need to remove the first patterned insulating layer 14. Advantageously, the risk that the first overcoat 13 may be harmed by the process of removing can be reduced. In the first nano material layer 12 of the nanoscale conductive film 20, multiple first regions 121 and multiple second regions 122 are defined. Specifically, in the etching process shown in FIGS. 2B and 2C, the first regions 121 are masked by the first patterned insulating layer 14 while the second regions 122 are not masked by the first patterned insulating layer 14. Consequently, after the etching process, the first regions 121 are electrically isolated from each other by the second regions 122 in the first nano material layer 12.

Figure 3A:
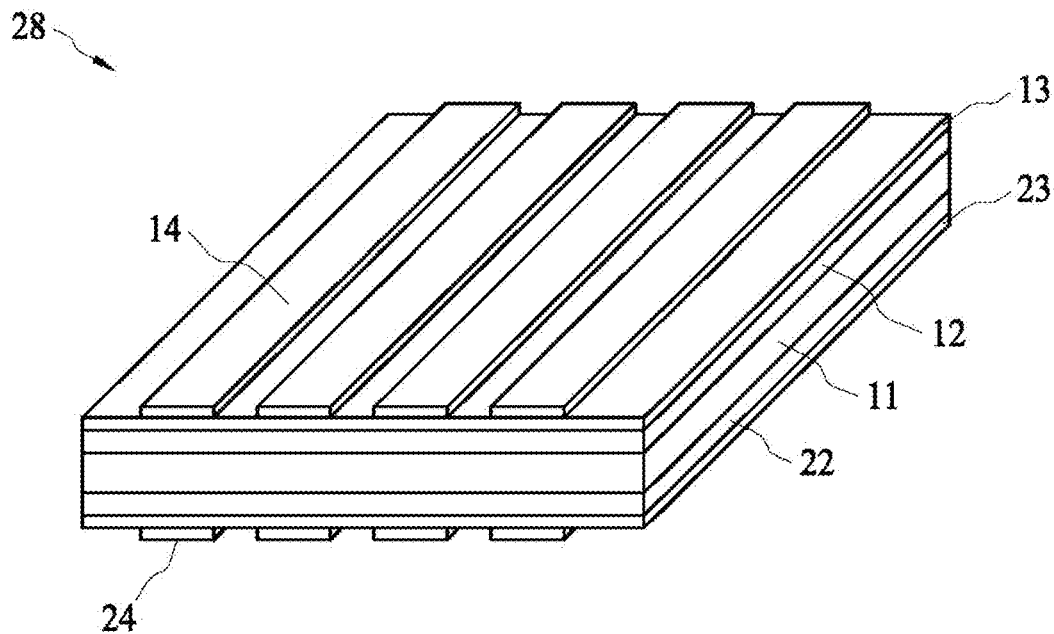

FIGS. 3A to 3D are schematic diagrams showing a method of manufacturing a nanoscale conductive film, in accordance with some embodiments. Referring to FIG. 3A, initially a nano base film 28 is provided, according to the method. The nanoscale base film 10 includes a substrate 11, a first overcoat 13 on one side of the substrate 11, a first nano material layer 12 laminated between the substrate 11 and the first overcoat 13, a second overcoat 23 on the other side of the substrate 11, and a second nano material layer 22 laminated between the substrate 11 and the second overcoat 23. In some embodiments, the second overcoat 23 and the second nano material layer 22 are similar to or identical with the first overcoat 13 and the first nano material layer 12, respectively, in material and structure, and therefore are not discussed.

Next, a first patterned insulating layer 14 and a second patterned insulating layer 24 are respectively formed on the first overcoat 13 and second overcoat 23 by, for example, coating an insulating layer on the first overcoat 13 and the second overcoat 23 followed by a printing, developing or transfer printing process. In some embodiments, the second patterned insulating layer 24 is similar to or identical with the first patterned insulating layer 14 in material and optical characteristics, and therefore is not discussed.

Figure 3B:
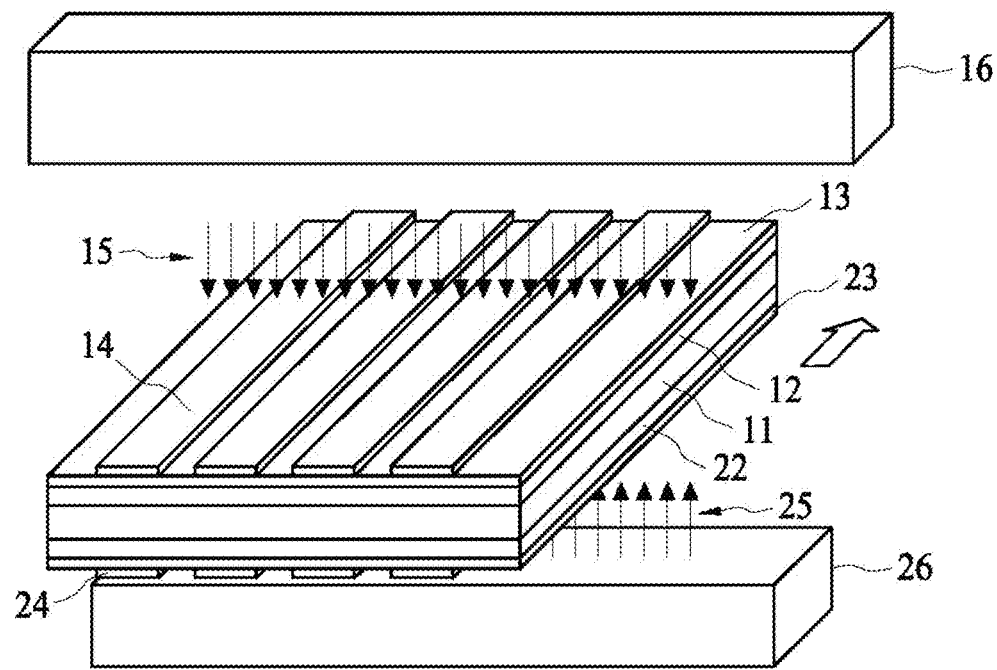

Referring to FIG. 3B, the first nano material layer 12 is etched, using the first patterned insulating layer 14 as a mask, in a current generation system 15. At the same time, the second nano material layer 22 is etched, using the second patterned insulating layer 24 as a mask, in another current generation system 25 such as a DBD system. In some embodiments, the first nano material layer 12 and the second nano material layer 22 are etched under the action of electrodes 16 and 26, respectively, along a predetermined direction (shown in a bold arrow). In some embodiments, the electrodes 16 and 26 may move in different directions or move independently of each other.

In some embodiments, the first nano material layer 12 is etched first, using the first patterned insulating layer 14 as a mask under the action of the electrode 16 in the current generation system 15. Subsequently, the second nano material layer 22 is etched, using the second patterned insulating layer 24 as a mask under the action of the electrode 16 in the same current generation system 15.

Similarly, the second nano material layer 22 may be etched first, using the second patterned insulating layer 24 as a mask under the action of the electrode 26 in the current generation system 25. Subsequently, the first nano material layer 12 is etched, using the first patterned insulating layer 14 as a mask under the action of the electrode 26 in the same current generation system 25.

Figure 3C:
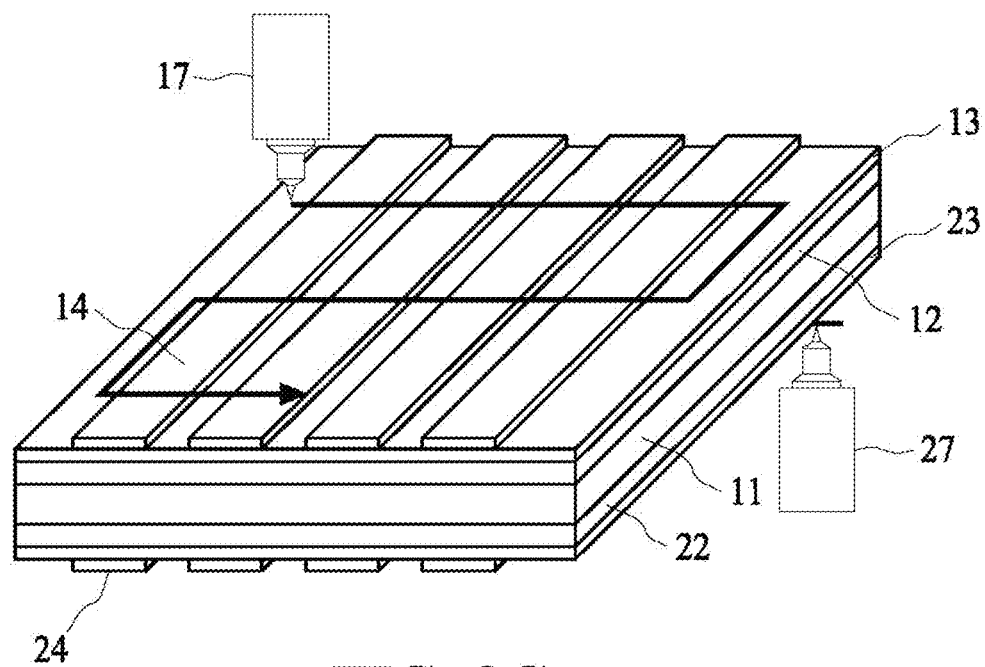

Referring to FIG. 3C, in some embodiments, the first nano material layer 12 is etched, using the first patterned insulating layer 14 as a mask, by a nozzle 17 along a predetermined path (indicated by an arrow) in an arc jet type current generation system. At the same time, the second nano material layer 22 is etched, using the second patterned insulating layer 24 as a mask, by a nozzle 27 along a predetermined path in another arc jet type current generation system.

In some embodiments, the first nano material layer 12 is etched first, using the first patterned insulating layer 14 as a mask, by the nozzle 17 along a predetermined path in an arc jet type current generation system. Subsequently, the second nano material layer 22 is etched, using the second patterned insulating layer 24 as a mask, by the nozzle 17 along a predetermined path in the same arc jet type current generation system.

Similarly, the second nano material layer 22 may be etched first, using the second patterned insulating layer 24 as a mask, by the nozzle 27 along a predetermined path in an arc jet type current generation system. Subsequently, the first nano material layer 12 is etched, using the first patterned insulating layer 14 as a mask, by the nozzle 27 along a predetermined path in the same arc jet type current generation system. In some embodiments, the nozzles 17 and 27 may move in different directions or move independently of each other.

Figure 3D:
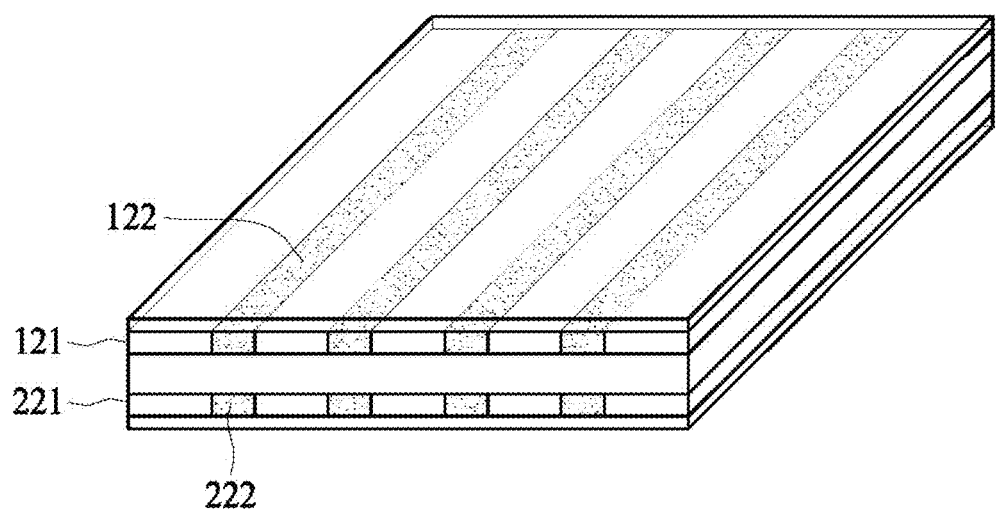

Referring to FIG. 3D, the first patterned insulating layer 14 and the second patterned insulating layer 24 are then removed, resulting in a nanoscale conductive film 30. In some embodiments, however, since the first patterned insulating layer 14 and the second patterned insulating layer 24 include a material having optical properties compatible with the first nano material layer 12 and the second nano material layer 22, there is no need to remove the first patterned insulating layer 14 and the second patterned insulating layer 24. Advantageously, the risk that the first overcoat 13 or the second overcoat 23 may be harmed by the process of removing can be reduced.

In the first nano material layer 12 of the nanoscale conductive film 30, multiple first regions 121 and multiple second regions 122 are defined. Specifically, in the etching process shown in FIGS. 3B and 3C, the first regions 121 are masked by the first patterned insulating layer 14 while the second regions 122 are not masked by the first patterned insulating layer 14. Consequently, after the etching process, the first regions 121 are electrically isolated from each other by the second regions 122 in the first nano material layer 12. In addition, in the second nano material layer 22 of the nanoscale conductive film 30, multiple first regions 221 and multiple second regions 222 are defined. Specifically, in the etching process shown in FIGS. 3B and 3C, the first regions 221 are masked by the second patterned insulating layer 24 while the second regions 222 are not masked by the second patterned insulating layer 24. Consequently, after the etching process the first regions 221 are electrically isolated from each other by the second regions 222 in the second nano material layer 22.

In some embodiments, the second patterned insulating layer 24 has a different pattern from the first patterned insulating layer 14. For example, the insulators of the second patterned insulating layer 24 are arranged in a first direction (for example, the X direction), while the insulators of the first patterned insulating layer 14 are arranged in a second direction (for example, the Y direction). As such, after the etching process shown in FIG. 3B or 3C, sensing electrodes formed on different sides of the substrate 11 may extend in different directions.

FIGS. 4A and 4B are schematic diagrams showing a method of manufacturing a nanoscale conductive film, in accordance with some embodiments. Referring to FIG. 4A, a nano base film 10 is provided. Instead of forming an insulating layer on the nano base film 10, first regions and second regions are defined in advance in the first nano material layer 12 of the nano base film 10. Moreover, the first regions are configured to keep electrical conductivity, while the second regions are configured to lose electrical conductivity. Furthermore, an etching path (indicated by an arrow) is defined by the second regions.

Subsequently, the second regions in the first nano material layer 12 of the nano base film 10 are etched by a nozzle 17 in an arc jet type current generation system so that in the first nano material layer 12 the first regions are electrically isolated from each other by the second regions. In some embodiments, the nano base film 10 is etched along the etching path defined by the second regions.

Referring to FIG. 4B, a nanoscale conductive film 40 is achieved after the nano base film 10 is etched. The first nano material layer 12 of the nanoscale conductive film 40 includes first regions 121 and second regions 122, in which the first regions 121 are electrically isolated from each other by the second regions 122.

FIGS. 5A and 5B are schematic diagrams showing a method of manufacturing a nanoscale conductive film, in accordance with some embodiments. Referring to FIG. 5A, a nano base film 28 is provided. Instead of forming an insulating layer on the nano base film 28, first regions and second regions are defined in advance in each of the first nano material layer 12 and the second nano material layer 22 of the nano base film 28. Moreover, the first regions are configured to keep electrical conductivity, while the second regions are configured to lose electrical conductivity. Furthermore, an etching path (indicated by an arrow) is defined by the second regions.

Subsequently, the second regions in the first nano material layer 12 of the nano base film 28 are etched by a nozzle 17 in an arc jet type current generation system so that in the first nano material layer 12 the first regions are electrically isolated from each other by the second regions. At the same time, the second regions in the second nano material layer 22 of the nano base film 28 are etched by a nozzle 27 in another arc jet type current generation system so that in the second nano material layer 22 the first regions are electrically isolated from each other by the second regions. In some embodiments, the nano base film 28 is etched along the etching path defined by the second regions.

In some embodiments, the first nano material layer 12 is etched first by a nozzle 17 along an etching path associated with the first nano material layer 12 in an arc jet type current generation system. Subsequently, the second nano material layer 22 is etched by the nozzle 17 along an etching path associated with the second nano material layer 22 in the same arc jet type current generation system.

Similarly, the second nano material layer 22 may be etched first by a nozzle 17 along an etching path associated with the second nano material layer 22 in an arc jet type current generation system. Subsequently, the first nano material layer 12 is etched by a nozzle 27 along an etching path associated with the first nano material layer 12 in the same arc jet type current generation system. Moreover, the nozzles 17 and 27 may move in different directions or move independently of each other. As a result, the sensing electrodes on the two sides of the substrate 11 as illustrated in FIG. 5B may be arranged in different directions. For example, the first nano material layer 12 is electrically conductive in a first direction (such as the X direction) and is not electrically conductive in a second direction (such as the Y direction). Further, the second nano material layer 22 is not electrically conductive in the first direction (the X direction) and is electrically conductive in the second direction (the Y direction).

Referring to FIG. 5B, a nanoscale conductive film 50 is achieved after the nano base film 28 is etched. The first nano material layer 12 of the nanoscale conductive film 50 includes first regions 121 and second regions 122, in which the first regions 121 are electrically isolated from each other by the second regions 122. Also, the second nano material layer 22 of the nanoscale conductive film 50 includes first regions 221 and second regions 222, in which the first regions 221 are electrically isolated from each other by the second regions 222.

FIGS. 6A and 6B are enlarged photo diagrams of a nanoscale conductive film before etching. Specifically, FIG. 6A is a photo image of an SNW conductive film taken by a scanning electron microscope (SEM), while FIG. 6B is a photo image of the SNW conductive film taken by a threedimensional (3D) laser microscope. Referring to both FIGS. 6A and 6B, silver nanowires in the SNW conductive film extend arbitrarily and interweave randomly in a high electrically conductive network. In addition, with the silver nanowires of a relatively high aspect ratio sparsely distributed in the network, the SNW conductive film exhibits excellent optical transparency, and has a relatively high electrical conductivity as well as high optical transmittance.

FIGS. 7A and 7B are enlarged photo diagrams of a nanoscale conductive film prepared according to some embodiments and a nanoscale conductive film prepared by an existing approach, respectively. Referring to FIG. 7A, in the SNW conductive film prepared according to some embodiments, the silver nanowires after etching are simply broken apart and not completely removed. As a result, the electrical conductivity of the SNW conductive film has been damaged, but the optical characteristics thereof are maintained. Referring to FIG. 7B, on the contrary, in the nanoscale conductive film prepared by the existing approach, the silver nanowires after etching have been substantially completely removed. Consequently, even though the electrical conductivity of such nanoscale conductive film is lost, the optical characteristics thereof are damaged as well and thus are quite different from those before etching.

FIGS. 7C and 7D are further enlarged photo diagrams of the nanoscale conductive films shown in FIGS. 7A and 7B, respectively. FIGS. 7C and 7D show the striking differences between the nanoscale conductive film prepared according to some embodiments and that prepared by an existing approach.

FIG. 8A is an enlarged photo diagram of a nanoscale conductive film prepared according to some embodiments. Referring to FIG. 8A, it can be found that broken points at the silver nanowires of the SNW conductive film seem to have been melted. Such a phenomenon is caused by the high voltage of the current generation system and the accompanying heat generated thereby. As previously discussed, since current-based etching in an atmospheric environment has a limited effect, the etching only breaks the silver nanowires without completely destroying the structure of an SNW. As a result, the methods according to the embodiments are able to achieve the desirable etching effect so as to define the electrical characteristics of a nanoscale conductive film while maintaining its optical characteristics.

FIG. 8B is a diagram showing the haze, before and after etching, of a nanoscale conductive film prepared according to some embodiments. Referring to FIG. 8B, the solid line indicates that the haze before etching (for example, at time T0) of an SNW conductive film prepared according to at least one of the embodiments described is approximately 0.8%, and the haze after etching (for example, at time T1) is also approximately 0.8%. Accordingly, there is no substantial change in the haze before and after etching. In some embodiments, in the nano material layer of the SNW conductive film, the difference of haze between the first regions not having been etched and the second regions having been etched is not greater than 0.3%, and preferably not greater than 0.1%.

In contrast, the dotted line indicates that the haze before etching (for example, at time T0) of an SNW conductive film prepared by an existing approach is approximately 0.8%, and the haze after etching (for example, at time T1) is also approximately 0.4%. Accordingly, the difference of haze is greater than 0.3%, which means a significant change.

In some embodiments, haze in a general definition refers to the measure of scattering calculated by the ratio in percentages between the flux of diffused light deflecting off the incident direction when transmits through a sample and the flux of transmitted light. To calculate haze ratio, the flux of diffused light that deflects off an incident direction by 2.5 degrees or above is taken into consideration.

FIGS. 9A and 9B are schematic diagrams showing optical performance of a nanoscale conductive film prepared by an existing approach. Referring to both FIGS. 9A and 9B, in the nanoscale conductive film prepared by the existing approach, the optical characteristics of first regions (conductive regions) 321 not having been etched and those of second regions (non-conductive regions) 322 having been etched are significantly different because nanowires in the second regions have been substantially removed during the etching process and thus the second regions exhibit significant color difference. In addition, the overcoat of the nanoscale conductive film may also be damaged by the etching, which further degrades the optical characteristics of the nanoscale conductive film.

FIGS. 10A and 10B are schematic diagrams of a nanoscale conductive film prepared according to some embodiments. Referring to FIGS. 10A and 10B, in the nanoscale conductive film prepared according to some embodiments, the optical characteristics of first regions (conductive regions) 421 not having been etched and those of second regions (non-conductive regions) 422 having been etched are not significantly different from each other because only nanowires in the second regions 422 are broken off and the structure of the second regions 422 is not adversely affected. Moreover, the overcoat of the nanoscale conductive film is obviously not damaged by the etching and thus the optical characteristics of the nanoscale conductive film are largely maintained.

FIG. 11 is a schematic cross-sectional view of a touch-panel display device 110, in accordance with various embodiments. Referring to FIG. 11, the touch-panel display device 110 includes a touch panel 60 and a display module 66. Moreover, the touch panel 60 includes a transparent substrate 71, a first sensing electrode layer 91 and a masking layer 75. The transparent substrate 71 has a first surface 711 and a second surface 712 on opposite sides of the transparent substrate 71, respectively. The first sensing electrode layer 91 is disposed on the first surface 711 of the transparent substrate 71. The masking layer 75 is also disposed on the first surface 711 of the transparent substrate 71 and surrounds the first sensing electrode layer 91.

In some embodiments, the transparent substrate 71 includes an optically transmissive material selected from glass, polymethyl methacrylate (PMMA), polyether sulfone (PES), polyacrylate, polyphenyl sulfide, poly allyl, polycarbonate, polyvinyl chloride (PVC), polypropylene (PP), polyethylene terephthalate (PET), polyethylene naphthalate (PEN), polycarbonate (PC) and polystyrene (PS). Moreover, the masking layer 75 includes an optically opaque material selected from black photo resist, black resin or black ink.

In some embodiments, the first sensing electrode layer 91 includes a nanoscale conductive film 20 as illustrated in FIG. 2D or a nanoscale conductive film 40 as illustrated in FIG. 4B. Moreover, the first sensing electrode layer 91 has an electrode pattern in which electrodes, for example, first electrodes and second electrodes, extend in a same direction and interleave with each other. In addition, the touch panel 60 and the display module 66 are attached to each other by a first adhesive layer 81. The first adhesive layer 81 includes optical clear resin (OCR) or optical clear adhesive (OCA). Further, the optical clear resin may include glue or optically transmissive, double-sided adhesive tape. The display module 66 includes a back-lit display such as a liquid crystal display (LCD), or a self-luminous display such as an organic light emitting diode (OLED) display.

FIG. 12 is a schematic cross-sectional view of a touch-panel display device 120, in accordance with various embodiments. Referring to FIG. 12, the touch-panel display device 120 includes a touch panel 70 that further includes a first carrier 72 between the transparent substrate 71 and the display module 66. The first sensing electrode layer 91, disposed on a surface of the first carrier 72, is attached to the transparent substrate 71 by the first adhesive layer 81. Moreover, the opposite surface of the first carrier 72 is attached to the display module 66 by a second adhesive layer 82. In some embodiments, the first carrier 72 includes an optically transmissive material selected from glass, polymethyl methacrylate (PMMA), polyether sulfone (PES), polyacrylate, polyphenyl sulfide, poly allyl, polycarbonate, polyvinyl chloride (PVC), polypropylene (PP), polyethylene terephthalate (PET), polyethylene naphthalate (PEN), polycarbonate (PC) and polystyrene (PS). Moreover, the second adhesive layer 82 includes optical clear resin (OCR) or optical clear adhesive (OCA).

FIG. 13 is a schematic cross-sectional view of a touch-panel display device 130, in accordance with various embodiments. Referring to FIG. 13, the touch-panel display device 130 includes a touch panel 80, in which a first sensing electrode layer 91 is disposed on a surface of the first carrier 72 and attached to the transparent substrate 71 by a first adhesive layer 81, and a second sensing electrode layer 92 is disposed on the opposite surface of the first carrier 72 and attached to the display module 66 by a second adhesive layer 82. In some embodiments, the second sensing electrode layer 92 includes a nanoscale conductive film 20 as illustrated in FIG. 2D or a nanoscale conductive film 40 as illustrated in FIG. 4B. Moreover, the first sensing electrode layer 91 includes first electrodes arranged in a first direction and second electrodes arranged in a second direction, which is substantially orthogonal to the first direction. Alternatively, the first and second sensing electrodes 91 and 92 may include electrodes prepared by the methods described and illustrated with reference to FIGS. 3A and 3B, FIGS. 3C and 3D, or FIGS. 5A and 5B, and arranged in different directions.

FIG. 14 is a schematic cross-sectional view of a touch-panel display device 140, in accordance with various embodiments. Referring to FIG. 14, the touch-panel display device 140 includes a touch panel 90, in which a first sensing electrode layer 91 is disposed on a surface of the transparent substrate 71, and a second sensing electrode layer 92 is disposed on a surface of the first carrier 72. Moreover, the first sensing electrode layer 91 and the second sensing electrode layer 92 are attached to each other by a first adhesive layer 81. Furthermore, the opposite surface of the first carrier 72 is attached to the display module 66 by a second adhesive layer 82.

FIG. 15 is a schematic cross-sectional view of a touch-panel display device 150, in accordance with various embodiments. Referring to FIG. 15, the touch-panel display device 150 includes a touch panel 100 that further includes a first carrier 72 between a transparent substrate 71 and a display module 66, and a second carrier 73 between the first carrier 72 and the display module 66. A first sensing electrode layer 91 is disposed on a surface of the first carrier 72, and a second sensing electrode layer 92 is disposed on a surface of the second carrier 73. Moreover, the opposite surface of the first carrier 72 is attached to the transparent substrate 71 by a first adhesive layer 81. The first sensing electrode layer 91 and the second sensing electrode layer 92 are attached to each other by a second adhesive layer 82. Furthermore, the opposite surface of the second carrier 73 is attached to the display module 66 by a third adhesive layer 83. In some embodiments, the second carrier 73 includes an optically transmissive material selected from glass, polymethyl methacrylate (PMMA), polyether sulfone (PES), polyacrylate, polyphenyl sulfide, poly allyl, polycarbonate, polyvinyl chloride (PVC), polypropylene (PP), polyethylene terephthalate (PET), polyethylene naphthalate (PEN), polycarbonate (PC) and polystyrene (PS). Moreover, the third adhesive layer 83 includes optical clear resin (OCR) or optical clear adhesive (OCA).

The methods of forming nanoscale conductive films in accordance with the embodiments of the disclosure can effectively achieve a desired etching effect in order to define the electrical characteristics of the nanoscale conductive films so that conductive regions are electrically isolated from each other by non-conductive regions in the nanoscale conductive films. Moreover, the methods can effectively reduce damage on an overcoat of a nanoscale conductive film caused during an etching process and maintain the optical characteristics of the nanoscale conductive film. Furthermore, compared to some existing approaches of forming nanoscale conductive films, the methods can significantly reduce manufacturing time. In addition, the etching process for the nanoscale conductive films prepared by the methods is conducted in a current generation system. As a result, conductive regions and non-conductive regions, either before or after etching, exhibit no obvious difference in optical performance. For example, the haze difference is not greater than 0.3% or even 0.1%, which makes it possible to hide the wiring in a touch-panel display device and thus adds an aesthetic touch to the appearance of the touch-panel display device.

Although the disclosure and its advantages have been described in detail, it should be understood that various changes, substitutions and alterations can be made herein without departing from the spirit and scope of the disclosure as defined by the appended claims.

The scope of the present disclosure is not intended to be limited to the particular embodiments of the process, machine, methods and steps described in the specification. As persons having ordinary skill in the art will readily appreciate from the disclosure, processes, machines, methods or steps, presently existing or later to be developed, that perform substantially the same function or achieve substantially the same result as the corresponding embodiments described herein may be utilized. Accordingly, the appended claims are intended to include within their scope such processes, machines, methods or steps.

What is claimed is:

1. A method of forming a nanostructure conductive film, the method comprising:
   providing a base film, the base film including a substrate, a first overcoat on one side of the substrate, and a first nanostructure layer laminated between the substrate and the first overcoat;
   forming a first patterned insulating layer on the first overcoat, the first patterned insulating layer exposing portions of the first overcoat and defining in the first nanostructure layer first regions masked by the first patterned insulating layer and second regions not masked by the first patterned insulating layer; and electrically isolating the first regions from each other by the second regions by ionizing the base film in a plasma system, using the first patterned insulating layer as a mask;

wherein a haze difference between the first regions and the second regions in the first nanostructure layer is not greater than 0.1%.

2. The method of claim 1, wherein ionizing the base film comprises introducing air, nitrogen or a combination thereof as a reactive gas.

3. The method of claim 1, wherein the plasma system includes one of a dielectric barrier discharge system or an arc jet system.

4. The method of claim 1, wherein the first nanostructure layer includes silver nanowire.

5. The method of claim 1, wherein the base film includes a second overcoat on the other side of the substrate, and a second nanostructure layer laminated between the substrate and the second overcoat, the method further comprising:

forming a second patterned insulating layer on the second overcoat, the second patterned insulating layer exposing portions of the second overcoat and defining in the second nanostructure layer first regions masked by the second patterned insulating layer and second regions not masked by the second patterned insulating layer; and electrically isolating the first regions from each other by the second regions by ionizing the base film in a plasma system, using the second patterned insulating layer as a mask.

6. The method of claim 5, wherein a haze difference between the first regions and the second regions in the second nanostructure layer is not greater than 0.1%.

7. A method of forming a nanostructure conductive film, the method comprising:

providing a base film, the base film including a substrate, a first overcoat on one side of the substrate, and a first nanostructure layer laminated between the substrate and the first overcoat and divided into first regions and second regions; and electrically isolating the first regions from each other by the second regions by ionizing the second regions in the first nanostructure layer of the base film in an arc jet system;

wherein a haze difference between the first regions and the second regions in the first nanostructure layer is not greater than 0.1%.

8. The method of claim 7, wherein ionizing the base film comprises introducing air, nitrogen or a combination thereof as a reactive gas.

9. The method of claim 7, wherein the first nanostructure layer includes silver nanowire.

10. The method of claim 7 further comprising using a first patterned insulating layer as a mask in ionizing the second regions.

11. The method of claim 7, wherein the nanostructure base film includes a second overcoat on the other side of the substrate, and a second nanostructure layer laminated between the substrate and the second overcoat and divided into first regions and second regions, the method further comprising:

electrically isolating in the second nanostructure layer the first regions from each other by the second regions by ionizing the second regions in the second nanostructure layer of the base film in an arc jet system.

12. The method of claim 11, wherein a haze difference between the first regions and the second regions in the second nanostructure layer is not greater than 0.1%.

* * * * *